(12) United States Patent
Pescini et al.

(10) Patent No.: US 7,618,492 B2
(45) Date of Patent: Nov. 17, 2009

(54) METHODS OF FORMING NANOCRYSTALS

(75) Inventors: Laura Pescini, Dresden (DE); Achim Gratz, Dresden (DE); Veronika Polei, Dresden (DE)

(73) Assignee: Infineon Technologies AG, Munich (DE)

( * ) Notice: Subject to any disclaimer, the term of this patent is extended or adjusted under 35 U.S.C. 154(b) by 351 days.

(21) Appl. No.: 11/200,458

(22) Filed: Aug. 9, 2005

(65) Prior Publication Data

US 2007/0034142 A1    Feb. 15, 2007

(51) Int. Cl.
  *C30B 21/02*    (2006.01)
(52) U.S. Cl. .............................. 117/89; 117/94; 117/95; 117/96
(58) Field of Classification Search .................. 117/89, 117/94, 95, 96
  See application file for complete search history.

(56) References Cited

U.S. PATENT DOCUMENTS

2006/0125056 A1*  6/2006  Samuelson et al. .......... 257/613
2007/0080425 A1*  4/2007  Lojek .......................... 257/510

OTHER PUBLICATIONS

Ammendola, G., et al., "Nanocrystal Memories for FLASH Device Applications," Solid-State Electronics, 2004, pp. 1483-1488, vol. 48, Elsevier Ltd.

Baron, T., et al., "Priority Communication: Silicon Quantum Dot Nucleation on $Si_3N_4$, $SiO_2$ and $SiO_xN_y$ Substrates for Nanoelectronic Devices," Journal of Crystal Growth, 2000, pp. 1004-1008, vol. 209, Elsevier Science B.V.

Crupi, I., et al., "Peculiar Aspects of Nanocrystal Memory Cells: Data and Extrapolations," IEEE Transactions on Nanotechnology, Dec. 2003, pp. 319-323, vol. 2, No. 4, IEEE.

De Salvo, B., et al., "How Far Will Silicon Nanocrystals Push the Scaling Limits of NVMs Technologies?," IEDM, May 2003, pp. 597-600, IEEE.

Gerardi, C. et al., "Performances of Si Nanocrystal Memories Obtained by by (sic) CVD and their Potentialities fo Further Scaling of Non-Volatile Memories," 2004 IEEE International Conference on Integrated Circuit Design and Technology, Apr. 2004, pp. 37-43, IEEE.

Mazen, F. et al., "Influence of the Chemical Properties of the Substrate on Silicon Quantum Dot Nucleation," Journal of the Electrochemical Society, 2003, pp. G203-G208, vol. 150, No. 3, The Electrochemical Society, Inc.

"Non Volatile Memories Based on Silicon Nanocrystal," downloaded Jul. 22, 2005, http://www.imm.cnr.it/en/imm_en/research/materials/non_volatile.htm, Consiglio Nazionale delle Ricerche, Istituto per la Microelettronica e Microsistemi, Italy.

(Continued)

*Primary Examiner*—Robert M Kunemund
(74) *Attorney, Agent, or Firm*—Slater & Matsil, L.L.P.

(57) ABSTRACT

Methods of selectively forming nanocrystals on semiconductor devices are disclosed. Regions of a workpiece are masked with a masking material, and the nanocrystals are formed on the unmasked regions. The nanocrystals may be formed by exposing the masked workpiece to a first substance, and exposing the workpiece to at least one second substance either before or after the masking material is removed.

19 Claims, 3 Drawing Sheets

OTHER PUBLICATIONS

Otten, F., et al., "Lithographic Tools for Producing Patterned Films Composed of Gas Phase Generated Nanocrystals," Materials Science and Technology, Jul. 2002, pp. 717-720, vol. 18, No. 7, Maney Publishing on behalf of Institute of Materials, Minerals and Mining, http://www.ingentaconnect.com/content/maney/mst/2002/00000018/00000007/art00002, downloaded Jul. 29, 2005.

Rao, R.A., et al., "Silicon Nanocrystal Based Memory Devices for NVM and DRAM Applications," Solid-State Electronics, 2004, pp. 1463-1473, vol. 48, Elsevier Ltd.

Wan, Y.M., et al., "Development of Silicon Nitride Dots for Nanocrystal Memory Cells," Solid-State Electronics, 2004, pp. 1519-1524, vol. 48, Elsevier Ltd.

* cited by examiner

METHODS OF FORMING NANOCRYSTALS

TECHNICAL FIELD

The present invention relates generally to the fabrication of semiconductor devices, and more particularly to the formation of nanocrystals and the integration thereof into the manufacturing processes for semiconductor devices.

BACKGROUND

Semiconductor devices are used in a variety of applications and technologies. Integrated circuits comprised of semiconductor devices are important components of many electronic and mechanical devices and systems, as examples. As semiconductor technology has progressed, the trend has been towards scaling down the size of semiconductor devices, in order to meet market demands for increased speed and performance, and smaller size.

A recent development in the semiconductor industry is the use of silicon nanocrystals. Silicon nanocrystals comprise very small silicon structures that may comprise a diameter of a few nanometers, e.g., ranging from about 2 to 10 nm. Because of their small size, they exhibit electrical, optical, and other properties that are advantageous in certain applications. Silicon nanocrystals are predicted to be useful in semiconductor applications such as non-volatile memory devices, optics, and other types of semiconductor devices.

One type of semiconductor device is a memory device, which is used to store information, typically as a logic "1" or "0". Memory devices may be static or dynamic. More recent memory designs comprise non-volatile memory (NVM) devices, which do not require that the data be refreshed during normal operation, as in dynamic memory devices, for example, and the data survives even with the power supply cut off, in contrast with static memory devices. Flash memory, used in digital cameras, for example, is one type of NVM device. Flash memory cells store a charge in a floating gate and are 'programmed' e.g., using Fowler-Nordheim tunneling, although flash memory cells may alternatively be programmed using other methods, such as channel hot electron injection.

Because current designs of flash memory cells are already quite small, it is a challenge to further shrink their size, due to the risk of losing data retention, degrading reliability, increasing floating gate interference, and drain turn on effect, as examples. Further reducing the size is particularly challenging for embedded flash memory cells, which comprise flash memory cells formed on the same integrated circuit or die as support circuitry and components, such as high voltage, peripheral, and logic circuitry. One proposed concept to reduce the size of flash memory cells is the use of discrete silicon nanocrystals instead of a polysilicon floating gate: the continuous floating gate is replaced by a plurality of nanocrystalline islands.

Figure 1:
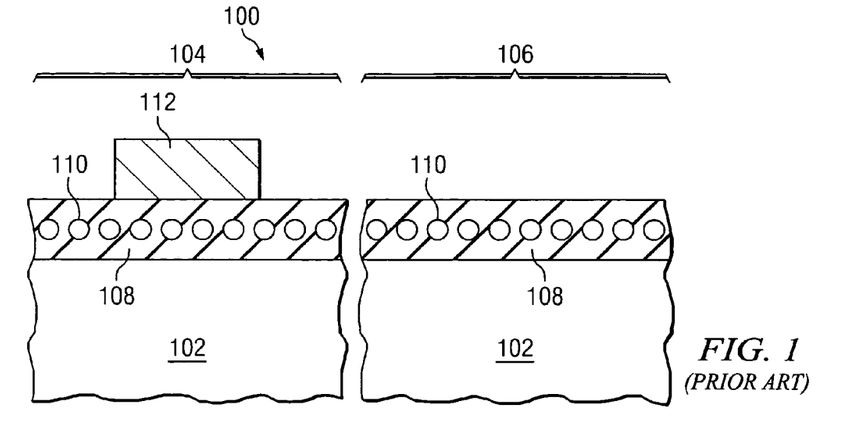
FIGS. 1 and 2 show cross-sectional views of a prior art method of forming silicon nanocrystals on a semiconductor device that requires an etch process to remove the silicon nanocrystals in undesired areas.
Figure 2:
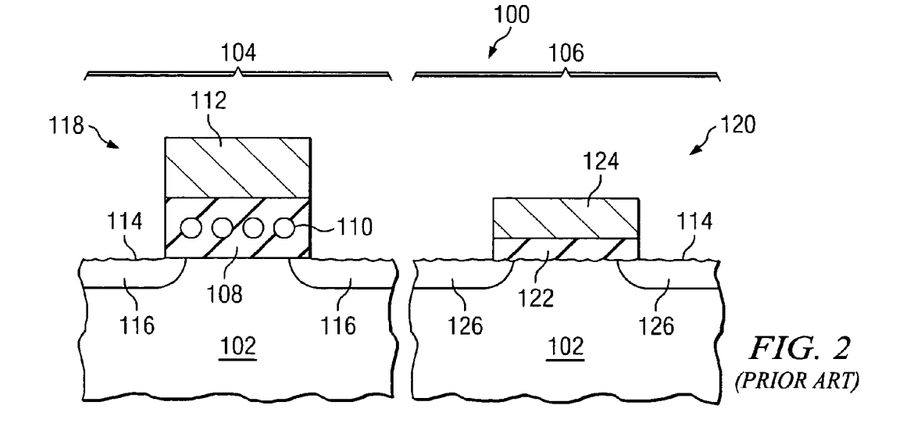

Some proposed integration schemes for implementation of silicon nanocrystals in flash memory cells involve depositing a blanket layer of silicon nanocrystals over an entire surface of a workpiece, and removing the deposited layer of silicon nanocrystals in areas where the silicon nanocrystals are not needed, as shown in FIGS. 1 and 2 in a cross-sectional view. The silicon nanocrystals are usually embedded in silicon dioxide or other insulating materials, for example. Proposed methods of forming silicon nanocrystals include one-step and two-step processes, with and without pre-treatment of the surface, as examples. The use of silicon nanocrystals instead of a floating gate has been found to decrease the operating and programming voltages of flash memory cells, which is advantageous, because the power requirements for the flash memory cells are decreased, and the periphery circuitry can be reduced in size.

However, the etch process for the removal of the silicon nanocrystals in undesired areas of a semiconductor device, such as in the regions for support circuitry and over the source and drain regions of the flash memory cell, is challenging, because the silicon and silicon dioxide of the layer of silicon nanocrystals must be removed selectively to silicon and silicon dioxide material layers already present in underlying material layers of the device. These etch processes require additional lithography steps and masking techniques, and may comprise etch processes that do not utilize an etch stop layer. Rather, the etch processes are stopped after a predetermined period of time; thus, the etch processes are poorly reproducible. Furthermore, damage to the top surface of the substrate and various material layers can occur during the etch processes, resulting in unpredictable or decreased device performance, and device failures. Another problem with attempting to etch away the undesired silicon nanocrystals is that the silicon nanocrystals and the insulating material the silicon nanocrystals are embedded in may not be etched away completely, also causing decreased device performance and device failures.

Another proposed integration scheme is to form silicon nanocrystals by implantation and a subsequent anneal, which lends itself to a patterned deposition when an implantation mask is employed. However, for flash memory devices, the end-of-range damage created by the implantation process has been found to be quite detrimental to the data retention properties of the flash memory cells.

Another proposed integration scheme for forming silicon nanocrystals is a lift-off technique, wherein a layer of silicon nanocrystals is removed together with a mask that is situated underneath the silicon nanocrystal layer. However, selecting a lift-off process that will not attack the nanocrystals or the substrate in the areas where they are supposed to remain is difficult, and the masking material has to be relatively thick for the lift-off to work correctly. An additional complication is that the nanocrystals will not be able to be embedded before the lift-off without impacting the ability to lift-off the mask fully. Furthermore, the nanocrystals on the mask tend to become loose during the lift-off process, and it is difficult to keep the nanocrystals in suspension. This results in an inability to create a production-worthy process, or in an inability to use a very fine pattern, as is required to integrate a substantial amount of flash memory cells.

Thus, what are needed in the art are improved methods of forming silicon nanocrystals and other types of nanocrystals in semiconductor devices.

SUMMARY OF THE INVENTION

These and other problems are generally solved or circumvented, and technical advantages are generally achieved, by preferred embodiments of the present invention, which comprise novel integration schemes for forming nanocrystals that involve using selective deposition of nanocrystals on a predetermined pattern. Regions of a semiconductor device where nanocrystal formation is not desired are masked, and the nanocrystals are formed only in regions where the nanocrystals are desired to be formed.

In accordance with a preferred embodiment of the present invention, a method of manufacturing a semiconductor device includes providing a workpiece, the workpiece comprising a first region and a second region, and selectively forming at least one nanocrystal on the first region of the workpiece, but not the second region of the workpiece.

In accordance with another preferred embodiment of the present invention, a method of manufacturing a flash memory cell includes providing a workpiece, the workpiece comprising a first region and a second region, and disposing a tunnel dielectric material over the workpiece. A masking material is formed over the tunnel dielectric material over the second region of the workpiece, leaving the tunnel dielectric material over the first region of the workpiece exposed. The tunnel dielectric material over the first region of the workpiece is exposed to a first substance, forming a plurality of nanocrystal formation locations on the tunnel dielectric material over the first region. The tunnel dielectric material over the first region of the workpiece is exposed to at least one second substance, forming a nanocrystal at each of the plurality of nanocrystal formation locations on the tunnel dielectric material. The masking material is removed, and a dielectric material is formed over the nanocrystals in the first region of the workpiece. A gate material is formed over the dielectric material in the first region of the workpiece.

Advantages of preferred embodiments of the present invention include providing novel methods of forming nanocrystals on semiconductor devices. Improved device performance and increased yields are achieved by embodiments of the present invention. Nanocrystals are selectively formed on regions of a workpiece, avoiding the need to remove the nanocrystals from undesired regions of the workpiece, which prevents damage to the workpiece and avoids the possibility of leaving some nanocrystals and dielectric materials in undesired regions. The novel integration schemes are production-worthy and result in the ability to form nanocrystals having very fine patterns. Flash memory devices and peripheral circuitry may be reduced in size in accordance with embodiments of the present invention.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, implemented in the manufacture of an embedded flash memory cell. The invention may also be applied, however, to other non-volatile and volatile memory devices, optical devices, and other semiconductor device applications.

FIGS. 1 and 2 show cross-sectional views of a prior art method of forming silicon nanocrystals on a semiconductor device that requires an etch process to remove the silicon nanocrystals from areas where the silicon nanocrystals are not desired to reside. A workpiece 102 comprising a semiconductor substrate is provided, and a plurality of silicon nanocrystals 110 are formed over the entire surface of the workpiece 102. The silicon nanocrystals 110 are embedded in an insulating layer 108 that typically comprises an oxide. The silicon nanocrystals 110 are formed over both a first region 104 and a second region 106 of the workpiece 102, wherein the first region 104 comprises a region of the workpiece 102 where flash memory cells will be formed, and wherein the second region 106 comprises a region of the workpiece 102 where flash memory cells will not be formed, e.g., a support circuitry region. A gate 112 may be formed over the insulating layer 108, which may comprise polysilicon. However, in some applications, the gate 112 may not yet be formed, for example.

In some prior art methods, the entire surface of the workpiece 102 is pretreated to form seeds for the silicon nanocrystals 110 to form and attach to, for example. For example, a method of forming silicon nanocrystals is described in a paper by Gerardi, et al., 2004 IEEE International Conference on Integrated Circuit Design and Technology, pp. 37 to 43, which is incorporated herein by reference. The method described by Gerardi, et al. includes hydroxylating a $SiO_2$ surface with a diluted HF solution. The pre-treatment controls the density of the silanol groups on the surface. The density of the silicon nanocrystals is directly related to the density of the silanol groups.

The silicon nanocrystals 110 are then removed from over regions of the workpiece 102 where they are not desired to reside. For example, a photoresist and/or hard mask (not shown) may be deposited over the optional gate 112 and the insulating layer 108 comprising the silicon nanocrystals 108. The photoresist and/or hard mask are patterned using lithography, and the photoresist and/or hard mask are used as a mask while the insulating layer 108 and silicon nanocrystals 110 are patterned.

Typically an etch stop layer cannot be used, or is not used, to pattern the insulating layer 108 and silicon nanocrystals 110. Therefore, a timed etch is typically used to remove the silicon nanocrystals 110 from unwanted regions. Furthermore, often the etchant used to remove the insulating layer 108 and silicon nanocrystals 110 also etches away a portion of the top surface of the workpiece 102, as shown in FIG. 2 at 114. Another possible outcome of the etch process is that some of the insulating layer 108 and silicon nanocrystals 110 may be left remaining in undesired locations on the workpiece 102 (not shown in the figures).

After the insulating layer 108 and silicon nanocrystals 110 are patterned to form the charge storage region of the flash memory cell (the silicon nanocrystals 110), the tunnel dielectric (the portion of 108 below the nanocrystals 110), and the gate dielectric (the portion of 108 above the nanocrystals 110), the manufacturing of the semiconductor device 100 is continued to form a flash memory cell 118 in the first region 104 of the workpiece 102 and support circuitry such as transistor 120 in the second region 106 of the workpiece 102. For example, the transistor 120 in the second region 106 may comprise a gate dielectric 122 formed over the substrate 120 and a gate 124 disposed over the gate dielectric 122. The transistor 120 typically includes source and drain regions 126 formed in the workpiece 102 proximate the gate 124 and gate dielectric 122, as shown. The flash memory cell 118 also includes source and drain regions 116 formed in the workpiece 102, as shown.

The etch process to remove the insulating layer 108 and silicon nanocrystals 110 from undesired regions of the workpiece 102 may cause damage 114 to the top surface of the workpiece 102 proximate the gate dielectric and floating gate 108/110 of the flash memory cell 118 and also to the entire top surface of the workpiece 102 in the second region. The damage 114 to the top surface of the workpiece results in decreased and unpredictable device performance, and may lead to device 100 failures. In order to prevent damage to the top surface of the workpiece 102, the etch process used may not be very strong; therefore, the etch process may result in a portion of the silicon nanocrystals 110 or tunnel dielectric 108 being left residing in undesired location, which also causes decreased and unpredictable device performance, and may lead to device 100 failures.

Embodiments of the present invention achieve technical advantages by preventing damage to the top surface of the workpiece by selectively forming nanocrystals in some regions, but not other regions of the workpiece. Nanocrystals are not formed where they are not desired to reside, which avoids the need to remove them from undesired locations.

FIGS. 3 through 9 show cross-sectional views of a semiconductor device at various stages of manufacturing in accordance with a preferred embodiment of the present invention. Like numerals are used for the elements as were used in FIGS. 1 through 2.

Figure 3:
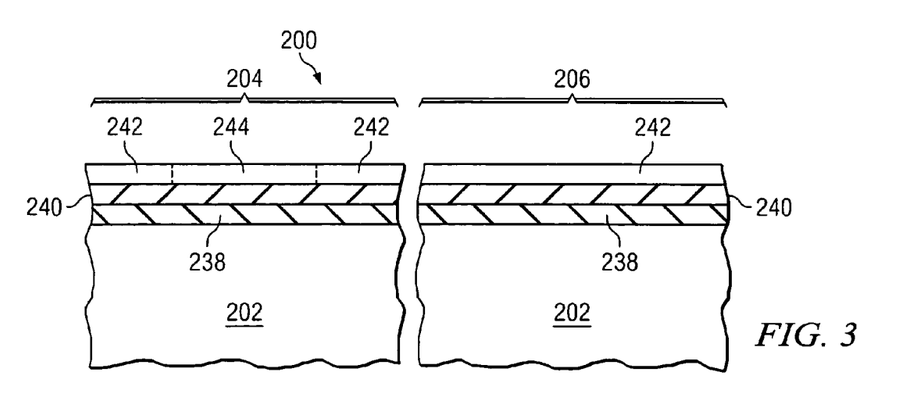
FIGS. 3 through 9 show cross-sectional views of a semiconductor device at various stages of manufacturing in accordance with a preferred embodiment of the present invention, wherein nanocrystals are selectively formed on regions of a workpiece.

Referring to FIG. 3, first, a workpiece 202 is provided. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may also comprise bulk Si, SiGe, Ge, SiC, or a silicon-on-insulator (SOI) substrate, as examples.

The workpiece 202 includes a first region 204 and a second region 206. The first region 204 comprises a region where nanocrystals will be formed, and the second region 206 comprises a region where nanocrystals will not be formed. In the embodiment shown, for example, the first region 204 comprises a region where a flash memory cell will be formed, and the second region 206 comprises a region wherein support circuitry for the flash memory cell will be formed, such as logic, high voltage, and other peripheral circuits and components.

An insulating material 238 may be formed or may be present on the top surface of the workpiece 202, as shown. The insulating material 238 will function as a tunnel dielectric in the flash memory cell, for example. The insulating material 238 may comprise about 3 nm or less of native oxide or a deposited insulating material, for example, and may comprise an oxide, a nitride, or an oxide and a nitride, as examples.

A masking material 240 is formed over the insulating material 238. The masking material 240 preferably comprises a material that may be etched selectively to the workpiece 202 material and/or the insulating material 238, for example, in one embodiment. The masking material 240 is preferably removable selectively to Si and $SiO_2$, as examples, in one embodiment. The masking material 240 preferably comprises a nitride, a metal, a carbide, a metal oxide, or multiple layers or combinations thereof, for example. The masking material 240 may comprise $Si_3N_4$, TiN, Ta, Ti, SiC, SiOC, $Al_2O_3$, TiO, or combinations thereof, as examples, although alternatively, the masking material 240 may comprise other materials. The masking material 240 may comprise a thickness of about 10 nm to 100 nm or about 100 nm or less, as examples, although alternatively, the masking material 240 may comprise other dimensions.

Figure 4:
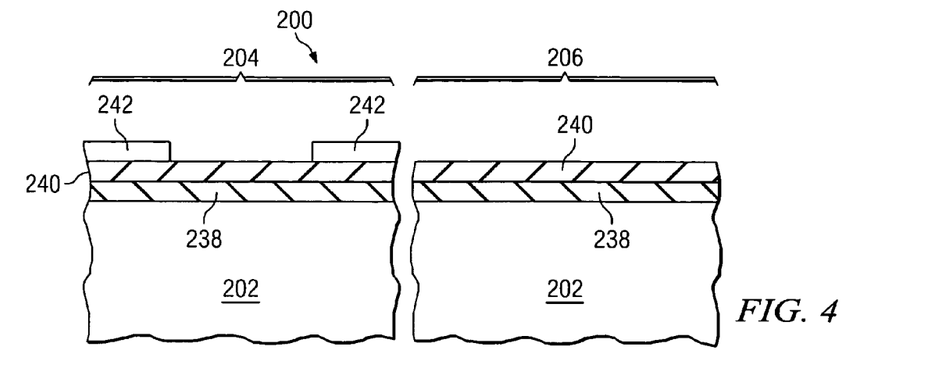

The masking material 240 is patterned to remove the masking material from a second region of the workpiece 202 and leave the masking material 240 residing over a first region of the workpiece 202. For example, a layer of photoresist 242 may be deposited over the masking material 240, as shown in FIG. 3. The layer of photoresist 242 is patterned with a pattern 244, which may comprise a pattern for a tunnel dielectric of a flash memory cell, for example. The layer of photoresist 242 is exposed and developed, as shown in FIG. 4. The layer of photoresist 242 is used as a mask while the masking material 240 is patterned, e.g., to transfer the pattern of the layer of photoresist to the masking material 240, leaving the structure shown in FIG. 5.

Figure 5:
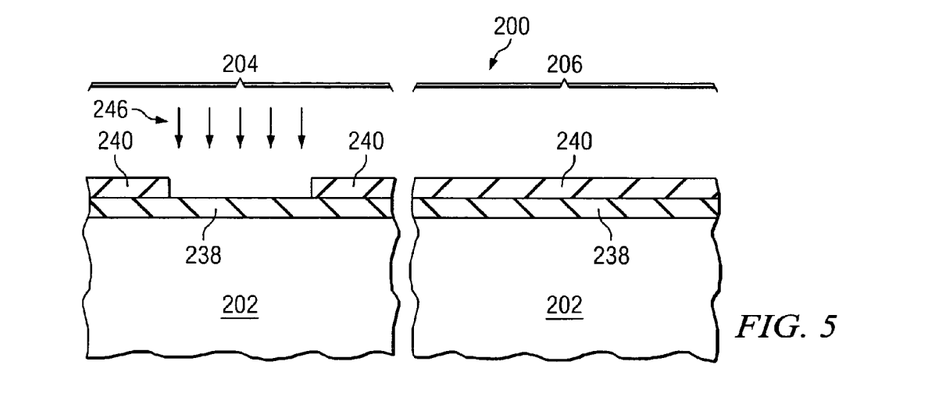

Next, with the masking material left residing over the insulating material 238, the unmasked regions of the insulating material 238 are exposed to a first substance 246 to treat the exposed regions of the insulating material 238 and make the surface of the insulating material 238 receptive to the formation of nanocrystals. In one embodiment, treating the unmasked regions of the insulating material 238 comprises hydroxylating the surface of the insulating material 238, for example. The first substance 246 may comprise a diluted HF solution, as an example, although alternatively, the first substance 246 may comprise other chemistries and/or materials.

Figure 6:
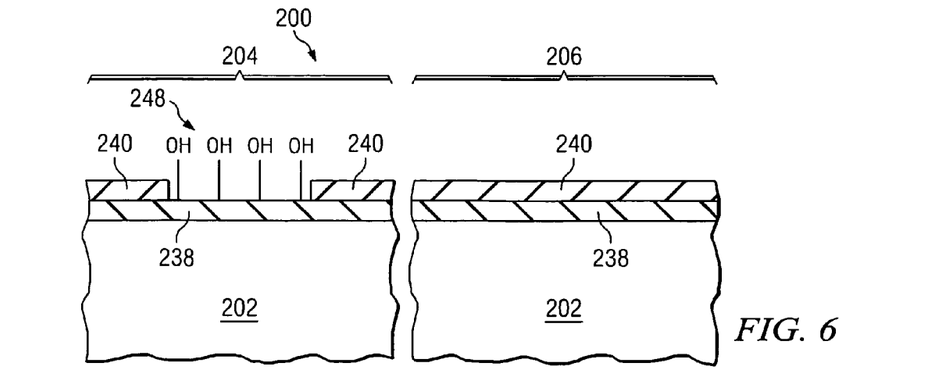

If the first substance 246 comprises a diluted HF solution, for example, exposing the unmasked regions of the insulating material 238 to the first substance 246 may result in the formation of OH groups 248 at the top surface of the insulating material 238, as shown in FIG. 6. The OH groups 248 advantageously function as seeds in a later step of exposing the insulating material 238 to a second substance 249 (FIGS. 7 and 8) to form nanocrystals 250 comprised of a material such as silicon, for example, to be described further herein. The OH groups 248 may comprise nanocrystal formation locations, in one embodiment, for example.

Figure 7:
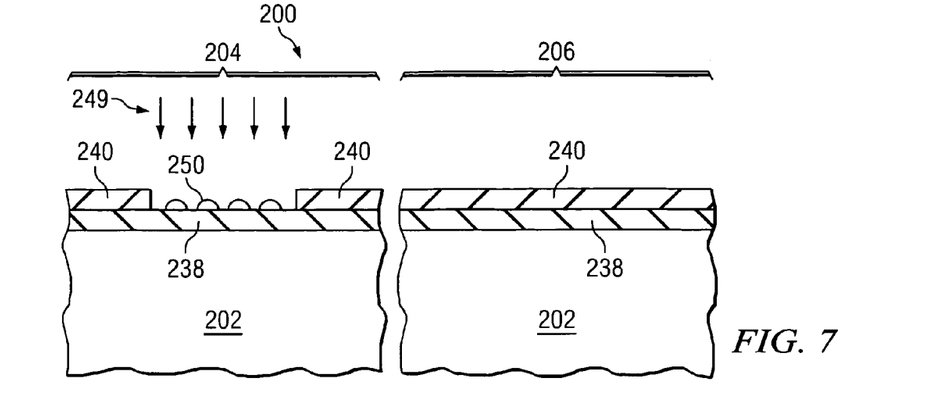

Next, in another embodiment, with the masking material 240 left residing over the insulating material 238, the workpiece 202 (and the material layers disposed thereon) are exposed to at least one second substance 249, forming nanocrystals 250 on the unmasked regions of the insulating material 238, as shown in FIG. 7. For example, a silicon nanocrystal 250 may form at each OH group 248, as shown in FIGS. 6 and 7, forming a plurality of islands of silicon nanocrystals 250. The masking material 240 is then removed from the insulating material 238, as shown in FIG. 8.

Figure 8:
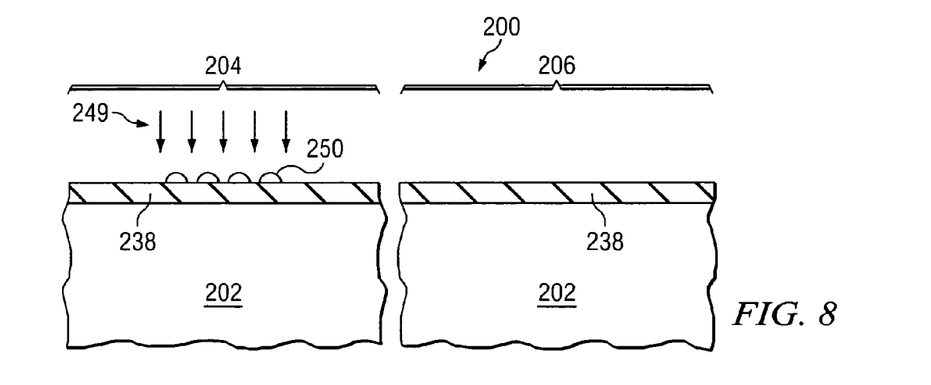

In another embodiment, after treating the surface of the masked insulating material 238 with the first substance 246, the masking material 240 is removed before treating the workpiece 202 with the at least one second substance 249, as shown in FIG. 8. Advantageously, because the first treatment or exposure to the first substance 246 was performed on the insulating material 238 while the masking material 240 was disposed over the insulating material 238, the nanocrystals 250 form only in regions of the insulating material 238 that were unmasked during the exposure to the first substance 246, that is, at the locations 248.

In one embodiment, the at least one second substance 249 preferably comprises a silicon-containing substance. In this embodiment, the at least one second substance 249 may comprise silane ($SiH_4$), dichlorsilane ($SiH_2Cl_2$), or both silane and dichlorsilane, as examples, although alternatively, the second substance 249 may comprise other chemistries and/or materials. For example, the second substance 249 may comprise silicon deposited by low pressure chemical vapor deposition (LPCVD).

In another embodiment, the second substance 249 may comprise a germanium-containing substance, such as $H_4Ge$, as an example. The nanocrystals 250 that are formed in this embodiment comprise germanium nanocrystals 250, for example.

In yet another embodiment, the second substance 249 may comprise a metal or a metal-organic precursor. The nanocrystals 250 that are formed in this embodiment comprise a metal, metal nitride, or metal oxide for example. The metal or metal-organic precursor 249 in this embodiment may comprise Al, AlN, Ti, TiN, Ta, TaN, W, WN, SnO, MgO, CaO, $RuO_2$, Pt, $PtO_2$, PdO, $ReO_3$, $OsO_4$, $IrO_2$, $Ir_2O_3$, or $Y_2O_3$, or combinations thereof, as examples, although other materials may alternatively be used.

The nanocrystals 250 preferably comprise a diameter of about 5 nm or less, although alternatively, the nanocrystals 250 may comprise other dimensions. The nanocrystals 250 are preferably spaced apart by about 5 nm, as an example, although alternatively, the nanocrystals 250 may be spaced apart by other dimensions.

Figure 9:
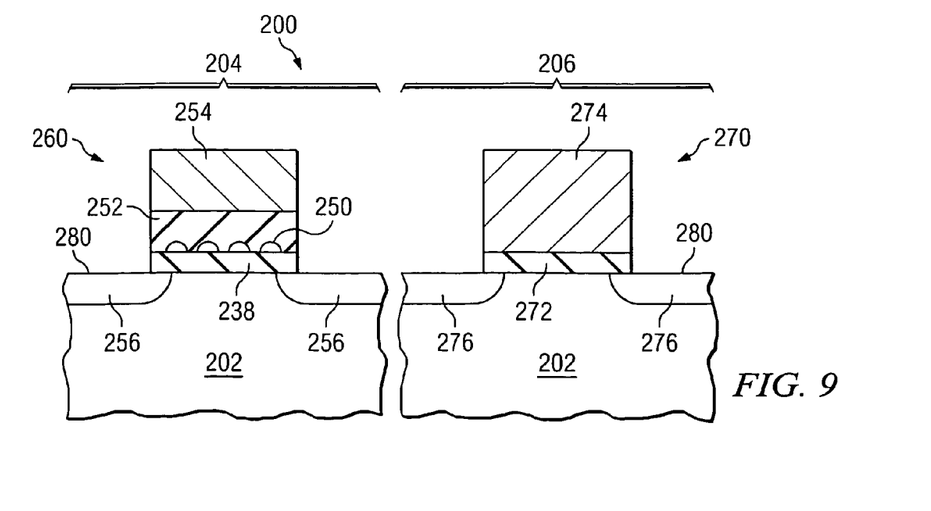

Manufacturing of the semiconductor device 200 is then continued, as shown in FIG. 9. For example, a gate insulator 252 may be formed over the nanocrystals 250, and a gate 254 may be formed over the gate insulator 252, in the first region 204. The workpiece 202 may be implanted to form source and drain regions 256, as shown, forming a flash memory cell 260. In the second region 206, devices and/or circuits such as transistor 270 may be formed in and over the workpiece 202. For example, a gate dielectric 272 may be deposited over the workpiece 202, and a gate 274 may be formed over the gate dielectric 272, as shown. The gate dielectric 272 of the transistor 270 may comprise the same material as the gate insulator 252 of the flash memory cell 260, for example. The workpiece 202 may be implanted with dopant materials to form source and drain regions 276, as shown.

In an optional embodiment, after the formation of the nanocrystals 250, either before or after the removal of the masking material 240, the nanocrystals 250 may be oxidized or passivated, e.g., by introducing $O_2$ plasma into the chamber in which the workpiece 202 is being processed. The $O_2$ plasma in this embodiment may advantageously only oxidize the nanocrystals 250, for example, because the insulating material 238 and the masking material 240 may not oxidize in the presence of the $O_2$ plasma, depending on the materials used.

Thus, embodiments of the present invention achieve technical advantages by pre-treating (e.g., with the first substance 246) only selected areas of a workpiece 202, therefore resulting in the formation of nanocrystals 250 only in the pre-treated, selected areas of the workpiece 202. Embodiments of the present invention utilize the fact that nanocrystal deposition is quite sensitive to the chemical properties of the surface, e.g., the surface of the insulating material 238. Using the masking material 240, a pattern for the chemical properties is created on the surface of the insulating material 238, rather than forming the nanocrystals over the entire surface of the insulating material 238 and then attempting later to remove the nanocrystals wherein they are not needed, which can be difficult to accomplish.

For example, if embodiments of the present invention are used to form silicon nanocrystals 250, the pre-treatment using the first substance 246 controls the density of the silanol groups on the surface of the insulating material 238, and the silicon nanocrystal 250 density is directly related to the silanol group density. The growth of the silicon nanocrystals 250 is controlled by creating a pattern for the chemical pre-treatment 246, which dominates the growth of the silicon nanocrystals 250. Advantageously, because no etch processes are required to remove the nanocrystals 250 from undesired areas of the workpiece 202, the top surface 280 remains intact and undamaged.

Embodiments of the present invention are particularly useful for embedded non-volatile memory semiconductor device applications, and may easily be integrated into the manufacturing processes for embedded flash technology, for example. Embodiments of the present invention advantageously provide integration of silicon nanocrystals into embedded flash memory designs having a gate length of less than about 130 nm, for example, and allow for further scaling (e.g., further reducing of the size) of flash memory cells and peripheral devices of embedded flash memory devices.

Advantages of preferred embodiments of the present invention include providing novel methods of forming nanocrystals and novel integration schemes for forming nanocrystal devices on semiconductor devices. Improved semiconductor device performance and increased yields are achieved by embodiments of the present invention. Because the nanocrystals are selectively formed on regions of a workpiece, the need to remove the nanocrystals from undesired regions of the workpiece using etch processes is avoided, which prevents damage to the workpiece and also avoids the possibility of leaving some nanocrystals and dielectric materials in undesired regions. The novel integration schemes are production-worthy and result in the ability to form nanocrystals having very fine patterns. Flash memory devices and peripheral circuitry may be reduced in size in accordance with embodiments of the present invention.

Furthermore, while embodiments of the present invention have been described with reference to non-volatile memory devices, embodiments of the present invention also have useful application in other semiconductor device applications. For example, embodiments of the present invention may be used in semiconductor optical devices, such as reflective devices or light-emitting devices. The novel methods of selectively forming nanocrystals described herein may be implemented in the manufacture of nanocrystal field-effect light-emitting devices (FELED's), and may be used in integrated circuits having integrated light sources, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a flash memory cell, the method comprising:
    providing a workpiece, the workpiece comprising a first region and a second region;
    disposing a tunnel dielectric material over the workpiece;
    forming a masking material over the tunnel dielectric material over the second region of the workpiece, leaving the tunnel dielectric material over the first region of the workpiece exposed;
    exposing the tunnel dielectric material over the first region of the workpiece to a first substance, forming a plurality of nanocrystal formation locations on the tunnel dielectric material over the first region;
    exposing the tunnel dielectric material over the first region of the workpiece to at least one second substance, selectively forming a nanocrystal at each of the plurality of nanocrystal formation locations on the tunnel dielectric material, while at a same time not forming nanocrystals on or over the masking material;
    removing the masking material;
    forming a dielectric material over the nanocrystals in the first region of the workpiece; and
    forming a gate material over the dielectric material in the first region of the workpiece.

2. The method according to claim 1, wherein the removing the masking material is performed before the exposing the tunnel dielectric material over the first region of the workpiece to the at least one second substance.

3. The method according to claim 1, wherein the exposing the tunnel dielectric material over the first region of the workpiece to a first substance comprises exposing the tunnel dielectric material to a diluted HF solution, wherein the forming the plurality of nanocrystal formation locations comprises forming a plurality of OH groups, wherein the exposing the tunnel dielectric material over the first region of the workpiece to the at least one second substance comprises exposing the tunnel dielectric material to silane ($SiH_4$), dichlorsilane ($SiH_2Cl_2$), or both silane and dichlorsilane, and wherein the selectively forming the nanocrystal comprises forming a silicon nanocrystal.

4. The method according to claim 1, further comprising forming support circuitry in the second region of the workpiece.

5. The method according to claim 1, wherein the forming the masking material comprises forming a nitride, a metal, a carbide, a metal oxide, or multiple layers or combinations thereof.

6. The method according to claim 1, wherein the selectively forming the nanocrystal comprises forming a silicon nanocrystal, a germanium nanocrystal, or a metal nanocrystal.

7. The method according to claim 1, wherein the forming the dielectric material over the nanocrystals in the first region of the workpiece further comprises forming the dielectric material over the second region of the workpiece, and wherein the forming the gate material over the dielectric material in the first region of the workpiece further comprises forming the gate material over the dielectric material in the second region of the workpiece.

8. The method according to claim 1, wherein the removing the masking material is performed after the exposing the tunnel dielectric material over the first region of the workpiece to the at least one second substance.

9. The method according to claim 1, wherein the exposing the tunnel dielectric material over the first region of the workpiece comprises hydroxylating the tunnel dielectric material over the first region of the workpiece.

10. The method according to claim 1, wherein the forming the masking material further comprises depositing the masking material over an entire surface of the workpiece, and removing the masking material from the first region of the workpiece.

11. The method according to claim 10, further comprising depositing a layer of photoresist over the masking material, patterning the layer of photoresist, and using the layer of photoresist as a mask to remove the masking material from over the first region of the workpiece.

12. The method according to claim 1, wherein the masking material comprises $Si_3N_4$, TiN, Ta, Ti, SiC, SiOC, $Al_2O_3$, TiG, or combinations thereof.

13. The method according to claim 1, wherein the at least one second substance comprises a silicon-containing substance, and wherein the selectively forming the nanocrystal comprises selectively forming a silicon nanocrystal.

14. The method according to claim 13, wherein the at least one second substance comprises silane ($SiH_4$), dichlorsilane ($SiH_2Cl_2$), or both silane and dichlorsilane.

15. The method according to claim 1, wherein the exposing the tunnel dielectric material over the first region of the workpiece to the at least one second substance comprises using low pressure chemical vapor deposition (LPCVD).

16. The method according to claim 1, wherein the at least one second substance comprises $H_4Ge$, Al, AlN, Ti, TiN, Ta, TaN, W, WN, SnO, MgO, CaO, $RuO_2$, Pt, $PtO_2$, PdO, $ReO_3$, $OsO_4$, $IrO_2$, $Ir_2O_3$, or $Y_2O_3$, or combinations thereof.

17. The method according to claim 1, wherein the exposing the tunnel dielectric material over the first region of the workpiece to a first substance comprises exposing the tunnel dielectric material to a diluted HF solution, and wherein the forming the plurality of nanocrystal formation locations comprises forming a plurality of OH groups.

18. The method according to claim 1, wherein the selectively forming the nanocrystal comprises forming a germanium nanocrystal.

19. The method according to claim 1, wherein the selectively forming the nanocrystal comprises forming a metal nanocrystal.

* * * * *

UNITED STATES PATENT AND TRADEMARK OFFICE
CERTIFICATE OF CORRECTION

PATENT NO. : 7,618,492 B2
APPLICATION NO. : 11/200458
DATED : November 17, 2009
INVENTOR(S) : Pescini et al.

It is certified that error appears in the above-identified patent and that said Letters Patent is hereby corrected as shown below:

In Col. 10, line 37, delete "TiG" and insert --TiO--.

Signed and Sealed this

Twelfth Day of January, 2010

David J. Kappos
*Director of the United States Patent and Trademark Office*